United States Patent
Wang et al.

(10) Patent No.: US 8,563,415 B2
(45) Date of Patent: Oct. 22, 2013

(54) SEMICONDUCTOR DEVICE AND METHOD OF MANUFACTURING THE SAME

(75) Inventors: Wenwu Wang, Beijing (CN); Shijie Chen, Beijing (CN); Xiaolei Wang, Beijing (CN); Kai Han, Beijing (CN); Dapeng Chen, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 218 days.

(21) Appl. No.: 13/061,879

(22) PCT Filed: Jun. 24, 2010

(86) PCT No.: PCT/CN2010/074382
§ 371 (c)(1),
(2), (4) Date: Mar. 2, 2011

(87) PCT Pub. No.: WO2011/057494
PCT Pub. Date: May 19, 2011

(65) Prior Publication Data
US 2011/0260255 A1 Oct. 27, 2011

(30) Foreign Application Priority Data
Nov. 11, 2009 (CN) .......................... 2009 1 0237545

(51) Int. Cl.
*H01L 21/3205* (2006.01)
*H01L 21/8238* (2006.01)
(52) U.S. Cl.
USPC .............................. 438/592; 438/199; 438/585

(58) Field of Classification Search
USPC .......... 438/199, 585, 587, 588, 592; 257/407, 257/E21.409, E27.06
See application file for complete search history.

(56) References Cited

U.S. PATENT DOCUMENTS

| | | | | |
|---|---|---|---|---|
| 7,297,587 B2 * | 11/2007 | Wu et al. | ....................... | 438/216 |
| 8,198,685 B2 * | 6/2012 | Liu et al. | ....................... | 257/369 |
| 2006/0289920 A1 * | 12/2006 | Wu et al. | ....................... | 257/310 |

* cited by examiner

Primary Examiner — Hung Vu
(74) Attorney, Agent, or Firm — Troutman Sanders LLP

(57) ABSTRACT

The present invention relates to a method of manufacturing a semiconductor device. After depositing the metal gate electrode material, a layer of oxygen molecule catalyzing layer having a catalyzing function to the oxygen molecules is deposited, and afterwards, a low-temperature PMA annealing process is used to decompose the oxygen molecules in the annealing atmosphere into more active oxygen atoms. These oxygen atoms are diffused into the high-k gate dielectric film through the metal gate to supplement the oxygen vacancies in the high-k film, in order to alleviate oxygen vacancies in the high-k film and improve the quality of the high-k film. According to the present invention, the oxygen vacancies and defects of high-k gate dielectric film will be alleviated, and further, growth of $SiO_x$ interface layer having a low dielectric constant caused by the traditional PDA high temperature process may be prevented. Thereby, the EOT of the entire gate dielectric layer may be effectively controlled, and the MOS device may be continuously scaled. Meanwhile, the present invention further provides a semiconductor device obtained according to the above-mentioned method.

11 Claims, 4 Drawing Sheets

SEMICONDUCTOR DEVICE AND METHOD OF MANUFACTURING THE SAME

BENEFIT CLAIMS

This application is a US National Stage of International Application No. PCT/CN2010/074382, filed Jun. 24, 2010, which claims the benefit of CN 200910237545.3, filed Nov. 11, 2009.

FIELD OF THE INVENTION

The present invention generally relates to a semiconductor device and a method of manufacturing the same, and more specifically, to a method of manufacturing a semiconductor device and the same device for alleviating oxygen vacancies in a high-k gate dielectric layer.

BACKGROUND OF THE INVENTION

With the development of the semiconductor industry, integrated circuits with higher performance and more powerful functions require greater element density. Thus, the sizes of the components need to be scaled further. The application of the core technology for the 32/22 nanometer process has been the inevitable trend for the development of integrated circuits, and is also one of the tasks that major international semiconductor companies and institutions compete to develop. Study on CMOS device gate engineering with the "high-k/metal gate" as the core technology is the most representative core process in 32/22 nanometer technology, and relevant research on materials, processes and structures has been widely conducted.

For an MOS device having a high-k/metal gate structure, the quality of high-k gate dielectric films, especially the oxygen vacancies and defect density of the high-k gate dielectric film, is essential to constantly improve the performance of the whole device. Currently, Hf-base high-k gate dielectric films have become the most potential candidate for industrialized materials, which have been successfully applied to the 45 nm process of Intel, and are expected to be applied to the next technology node. However, there exists serious problems caused by oxygen vacancies in the Hf-base high-k gate dielectric film, such as degradation of the threshold voltage and the mobility of channel carriers, and reduction of reliability, etc. Therefore, it has become a challenge to alleviate oxygen vacancies and defect density in the high-k gate dielectric film. Moreover, another significant parameter of an MOS device is Equivalent Oxide Thickness (EOT), and a sufficiently small EOT is essential to ensure scaling and performance enhancement of the MOS device. The enhancement for the quality of films and the reduction of the thickness for the $SiO_x$ interface layer of low dielectric constant are expected by continuous improvement of processes, in order to meet the requirements for the scaling of a 32/22 nanometer technology MOS device.

1. In the process for manufacturing an MOS device with a high-k metal structure in prior art, the high-k film layer are typically formed by a chemical method (atomic layer deposition or metal organic chemical vapor deposition), which may cause more defects and charge traps, and insufficient density and compactness of the high-k film. In order to improve the density and compactness of the high-k film and alleviate oxygen vacancies and defect traps, a postdeposition annealing (PDA) is typically required to be conducted in the temperature ranging from about 400 to 1100° C. However, in this process, oxygen in the annealing atmosphere will diffuse into the MOS device with a high-k metal gate structure under the high temperature, reach the $SiO_2$/Si interface through the dielectric layer, and react with the silicon substrate to generate $SiO_2$, thereby thickening the $SiO_2$ interface layer. It disadvantageously leads to increase of EOT for the whole gate structure and degradation of the overall performance for the MOS device. On the other hand, a Post Metal Annealing (PMA) may be conducted to the MOS device after deposition of a double metal gate, so as to improve the quality of the high-k gate dielectric film. However, this method only allows less oxygen to diffuse into the high-k gate dielectric film, which may partially supplement the oxygen vacancies and defect traps in the high-k gate dielectric film, and there is still a lot of oxygen vacancies and defect traps in the film.

Therefore, there is a need for a semiconductor device and a method of manufacturing the same to alleviate the oxygen vacancy defects in a high-k gate dielectric film.

SUMMARY OF THE INVENTION

In view of the above-mentioned problems, the present invention proposes a method of manufacturing a semiconductor device. The method comprises: providing a semiconductor substrate having a first region and a second region; forming an interface layer on the semiconductor substrate; forming a gate dielectric layer on the interface layer; forming a first work function metal gate layer belonging to the first region and a second work function metal gate layer belonging to a second region on the gate dielectric layer, respectively; forming an oxygen molecule catalyzing layer on the first and second work function metal gate layers; annealing the device so as to decompose oxygen molecules in annealing environment into oxygen atoms which are thereby diffused in the gate dielectric to supplement oxygen vacancies and defects; forming a polycrystalline silicon layer on the oxygen molecule catalyzing layer; processing the device to form a first gate belonging to the first region and a second gate belonging to the second region, respectively, wherein the annealing is low-temperature PMA annealing in an annealing temperature ranging from about 100° C. to 600° C. The oxygen molecule catalyzing layer is formed by a material comprising Pt. The gate dielectric layer may be selecting from a group comprising HfSiO, HfSiON, HfTaO, HfTiO, HfZrO, LaAlO, $La_2O_3$, and HfLaO, or any combination thereof.

The present invention further provides a semiconductor device formed by the above-mentioned method. The semiconductor device comprises: a semiconductor substrate having a first region and a second region, wherein the doping type of the first region is different from the second region; a first gate structure formed on the first region and a second gate structure formed on the second region, wherein the first gate structure comprises: an interface layer on the semiconductor substrate, a gate dielectric layer on the interface layer, a first work function metal gate layer belonging to the first region on the gate dielectric layer, an oxygen molecule catalyzing layer on the first work function metal gate layer, and a polycrystalline silicon layer on the oxygen molecule catalyzing layer, and the second gate structure comprises: an interface layer on the semiconductor substrate, a gate dielectric layer on the interface layer, a second work function metal gate layer belonging to the second region on the gate dielectric layer, an oxygen molecule catalyzing layer on the second work function metal gate layer, and a polycrystalline silicon layer on the oxygen molecule catalyzing layer.

Through the present invention, the oxygen vacancies and defects of high-k gate dielectric film may be alleviated by the catalyzing decomposition of the catalyzing layer to oxygen molecules at lower temperature, and the growth of low dielectric constant $SiO_x$ interface layer caused by the traditional PDA high temperature process may be prevented, and thus EOT of the entire gate dielectric layer may be controlled effectively, and the MOS device may be scaled continuously.

DETAILED DESCRIPTION OF THE INVENTION

The present invention generally relates to a method of manufacturing a semiconductor device, and more particularly, to a method of alleviating oxygen vacancies in a high-k gate dielectric layer. The following disclosure provides a plurality of different embodiments or examples to achieve different structure of the present invention. To simplify the disclosure of the present invention, description of the components and arrangements of specific examples is given below. Of course, they are only illustrative and not limiting the present invention. Moreover, in the present invention, reference numbers and/or letters may be repeated in different embodiments. Such repetition is for the purposes of simplification and clearness, and does not denote the relationship between respective embodiments and/or arrangements being discussed. In addition, the present invention provides various examples for specific process and materials. However, it is obvious for a person of ordinary skill in the art that other process and/or materials may alternatively be utilized. Furthermore, the following structure in which a first object is "on" a second object may comprise an embodiment in which the first object and the second object are formed to be in direct contact with each other, and may also comprise an embodiment in which another object is formed between the first object and the second object such that the first and second objects might not be in direct contact with each other.

Figure 1:
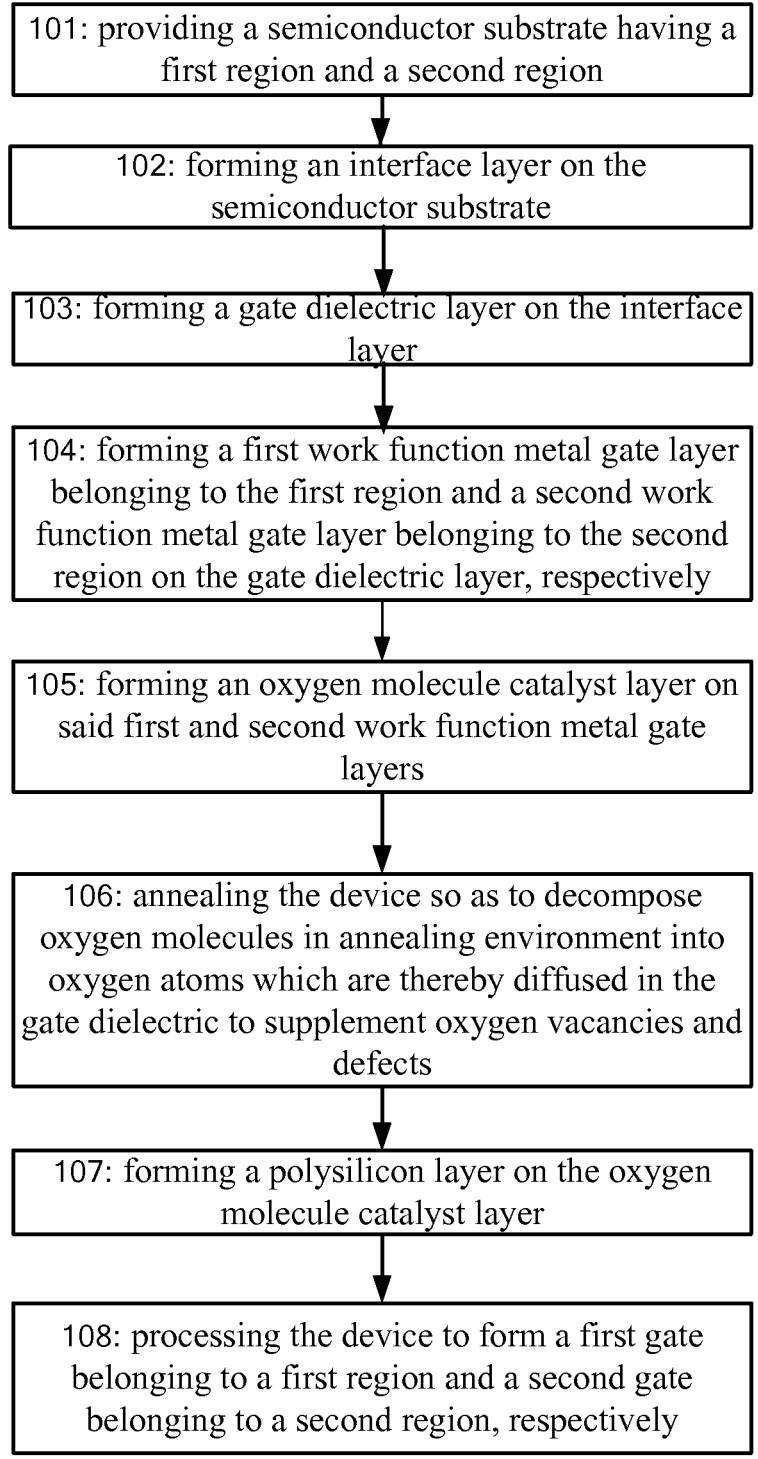
FIG. 1 is a flowchart illustrating a method of manufacturing a semiconductor device according to an embodiment of the present invention.

With reference to FIG. 1, FIG. 1 is a flowchart illustrating a method of manufacturing a semiconductor according to an embodiment of the present invention. This method may be comprised in a formation process of an integrated circuit or a part thereof, and may comprise a static random access memory (SRAM) and/or other logic circuit, a passive element such as a resistor, capacitor and inductor, and an active element, for example, a P-channel field effect transistor (PFET), N-channel field effect transistor (NFET), metal oxide semiconductor field effect transistor (MOSFET), complementary metal oxide semiconductor (CMOS) transistor, bipolar transistor, high voltage transistor, and high frequency transistor, and other memory units, any combination thereof and/or other semiconductor devices.

Figure 2:
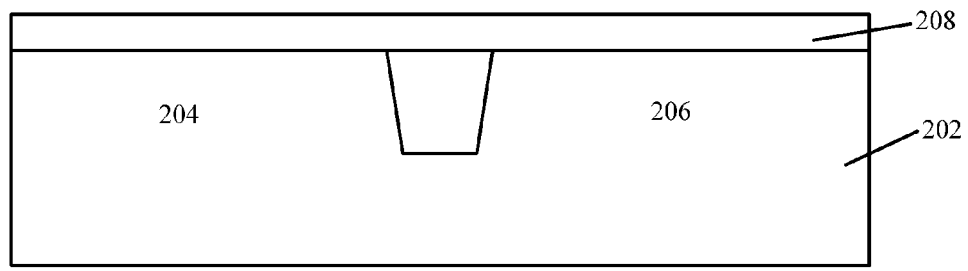
FIGS. 2-9 are structural diagrams illustrating various aspects for a semiconductor device according to the present invention.

In step 101, a semiconductor substrate 202 (for example, a wafer) are provided, wherein the semiconductor substrate 202 has a first region 204 and a second region 206. With Reference to FIG. 2, the substrate 202 comprises a silicon substrate in a crystal structure. As is known in the art, the substrate may comprise a variety of different doping configurations (for example, p-type substrate or n-type substrate) according to design specifications, wherein the doping type of the first region 204 is different from that of the second region 206. Other examples of the substrate may comprise semiconductors of other elements, for example geranium and diamond. Alternatively, the substrate may comprise a compound semiconductor, for example silicon carbide, gallium arsenide, indium arsenide, or indium phosphide. Furthermore, in order to improve performance, the substrate may selectively comprise an epitaxial layer (epi layer) and/or silicon-on-insulator (SOI) structure. Moreover, the substrate may comprise a plurality of features formed thereon, for example, an active region, a source and drain region in the active region, an isolation region (for example a shallow trench isolation (STI)), and/or other features known in the art, and the semiconductor substrate may be provided by preliminary process, for example, rinsing process, wherein the rinsing agent may comprise $H_2SO_4$, HCl, $H_2O_2$, $NH_4OH$, and HF, etc. As shown in FIG. 2, a semiconductor substrate 202 is provided, wherein the semiconductor substrate 202 has a first region 204 and a second region 206.

In step 102, an interface layer 208 is formed on the substrate 202, as shown in FIG. 2. The interface layer 208 may be directly formed on the substrate 202. In this embodiment, the interface layer 208 is formed of $SiO_2$. The thickness of the interface layer 208 is in the range of 0.2-1 nm, preferably in the range of 0.2-0.8 nm, and the most preferably in the range of 0.2-0.7 nm. An interface layer may also be formed of other materials, for example, silicon nitride or silicon oxynitride material. The interface layer 208 may be formed by atomic layer deposition, chemical vapor deposition (CVD), high density plasma CVD, sputtering or other suitable method. The foregoing description is only for the purpose of illustrative, and the invention is not limited thereto.

Figure 3:
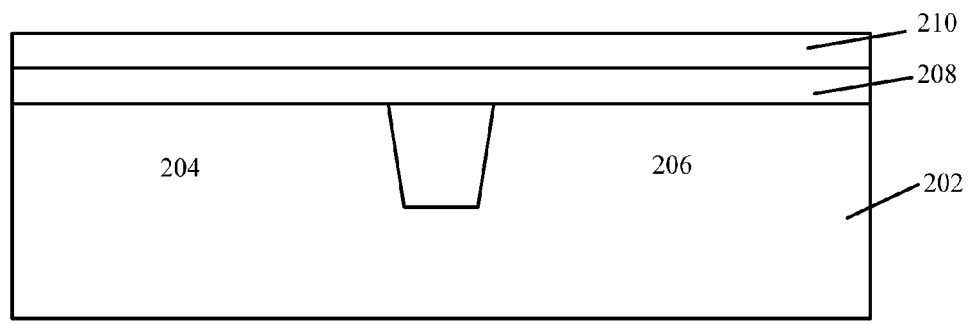

The flow then goes to step 103, in which a gate dielectric layer 210 is formed on the interface layer 208, as shown in FIG. 3. The gate dielectric layer 210 may comprise a high-k material (for example, materials having higher dielectric constant than silicon oxide). The High-k dielectric may comprise Hf-base materials, such as $HfO_2$, HfSiO, HfSiON, HfTaO, HfTiO, HfZrO, and any combination thereof and/or other suitable materials. The gate dielectric layer 210 may comprise a plurality of layers, such as the layers used in forming an nMOS transistor gate structure and/or a pMOS transistor gate structure. The gate dielectric layer may be formed by thermal oxidation, chemical vapor deposition, and atomic layer deposition (ALD). In this embodiment, the thickness of the gate dielectric layer is in the range of about 2-10 nm, preferably in the range of 2-5 nm. The foregoing description is only for the purpose of illustrative, and the invention is not limited thereto. In this embodiment, the thickness of the high-k dielectric layer (for example, $HfO_2$) is in the range of about 2-3 nm (for example, in the 22 nm technology node).

Figure 4:
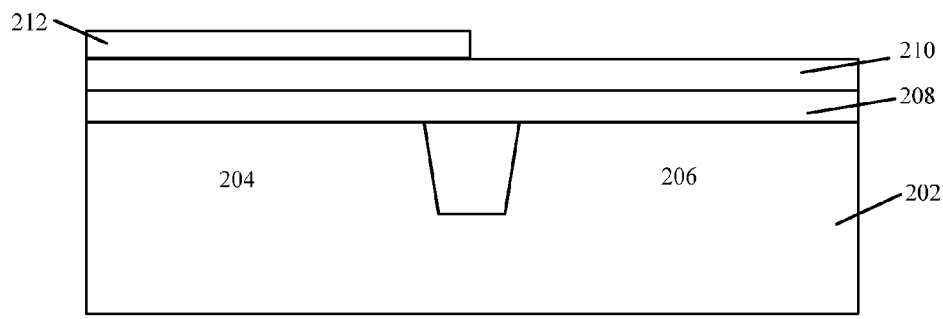
Figure 5:
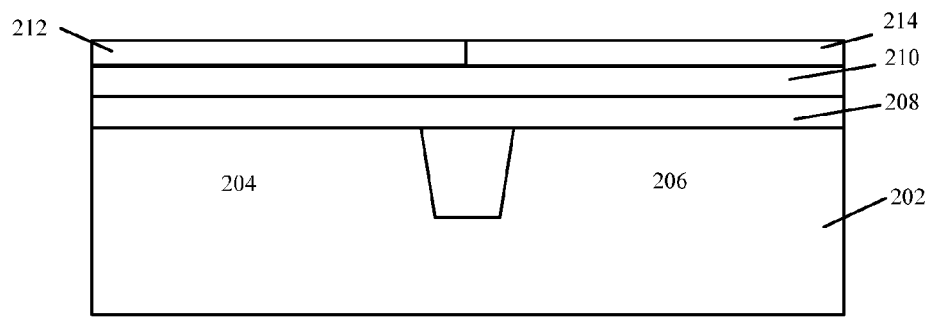

The flow then goes to step 104, as shown in FIGS. 4 and 5, in which a work function metal gate layer 212 for work function control is formed in the first region and a work function metal gate layer 214 for work function control is formed in the second region. As shown in FIG. 4, after forming the gate dielectric layer 210, the work function metal gate layer 212 belonging to the first region may be deposited thereon. The work function metal gate layer 212 may have a thickness in the range of about 2 nm-50 nm. The materials for the work function metal gate layer 212 may comprise TaC, HfC, TiC, TiN, TaN, TaTbN, TaErN, TaYbN, TaSiN, HfSiN, MoSiN, $RuTa_x$, $NiTa_x$, polycrystalline silicon, and metal silicide, or any combination thereof. As shown in FIG. 5, the work function metal gate layer 214 belonging to the second region may be deposited on the gate dielectric layer 210. The thickness of the work function metal gate layer may be in the range of about 2 nm-50 nm. The materials for the work function metal gate layer 214 may comprise TaCx, TiN, TaN, MoNx, TiSiN, TiCN, TaAlC, TiAlN, PtSix, Ni3Si, Pt, Ru, Ir, Mo, HfRu, RuOx, polycrystalline silicon, and metal silicide, or any combination thereof.

Figure 6:
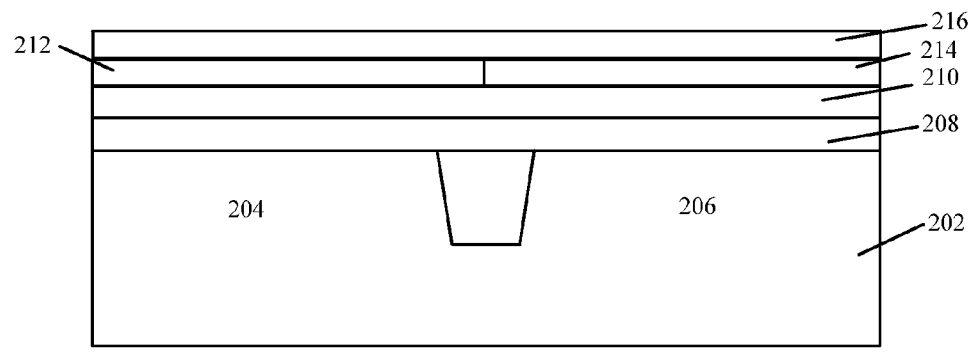

In step 105, with reference to FIG. 6, an oxygen molecule catalyzing layer 216 for oxygen molecule catalyzing is formed on the first and second work function metal gate layers. In this embodiment, the oxygen molecule catalyzing layer 216 is formed of a platinum (Pt) layer. The oxygen molecule catalyzing layer 216 may also be formed of other oxygen molecule catalyzing materials, for example, Co, Zn, Pd, $PtBi_x$, $PtNi_x$, etc., or any combination thereof, and have a thickness in the range of about 1-100 nm, preferably in the range of 2-50 nm, and most preferably in the range of 5-20 nm. The platinum layer may be formed by, such as, atomic layer deposition (ALD), sputtering deposition, electron beam deposition, etc. The oxygen molecule catalyzing layer may comprise more than one layer. For example, it may comprise a plurality of layers. The catalyzing layer may not be a "layer," but a relatively small region to alleviate the influence of the oxygen molecule catalyzing layer on the work function metal layers. The foregoing description is only for the purpose of illustrative, and the invention is not limited thereto.

Figure 7:
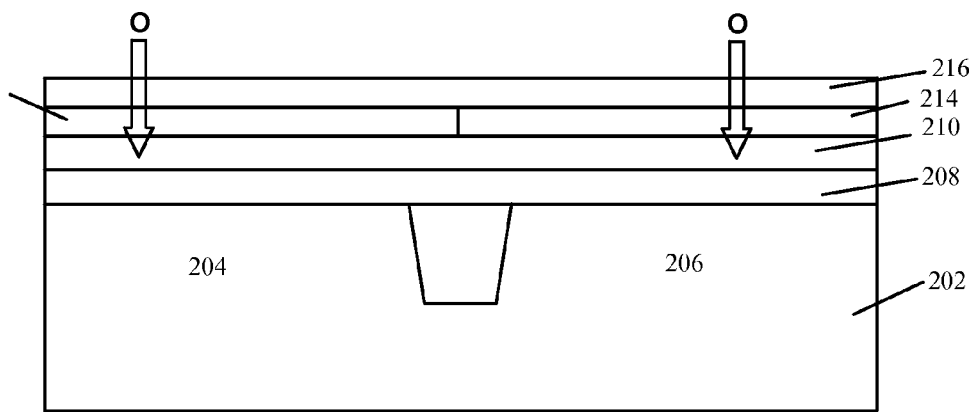

In step 106, with reference to FIG. 7, after depositing the oxygen molecule catalyzing metal layer 216, the resulting structure is annealed in atmosphere or low-pressure atmosphere containing oxygen, such that the oxygen molecule in the annealing atmosphere may be decomposed into oxygen atoms, which may be diffused into the gate dielectric to supplement the oxygen vacancies and defects. In this embodiment, the annealing may be carried out by using rapid thermal annealing (RTA) at a temperature below 600° C., for example, in the range of about 100-600° C., preferably in the range of 200-500° C., and most preferably in the range of 300-400° C. During the low-temperature annealing process, the oxygen molecules in the annealing atmosphere will be decomposed into more active oxygen atoms, which may be diffused into the high-k gate dielectric film to supplement the oxygen vacancies and defects. Of course, other annealing processes may also be carried out, for example, plasma-assisted thermal treatment.

Figure 8:
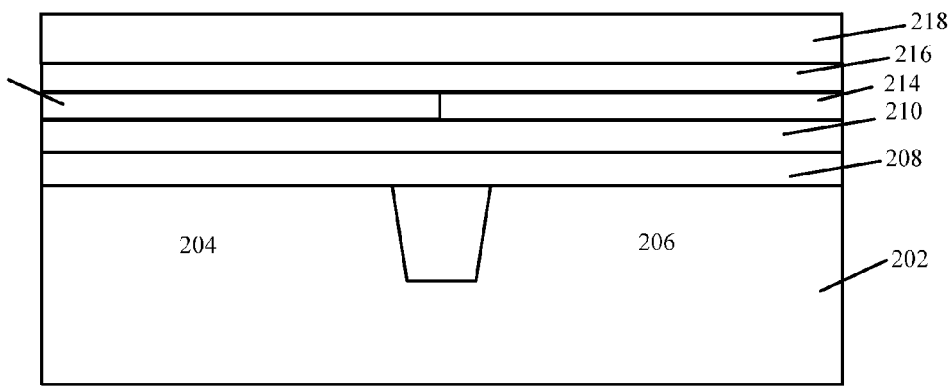
Figure 9:
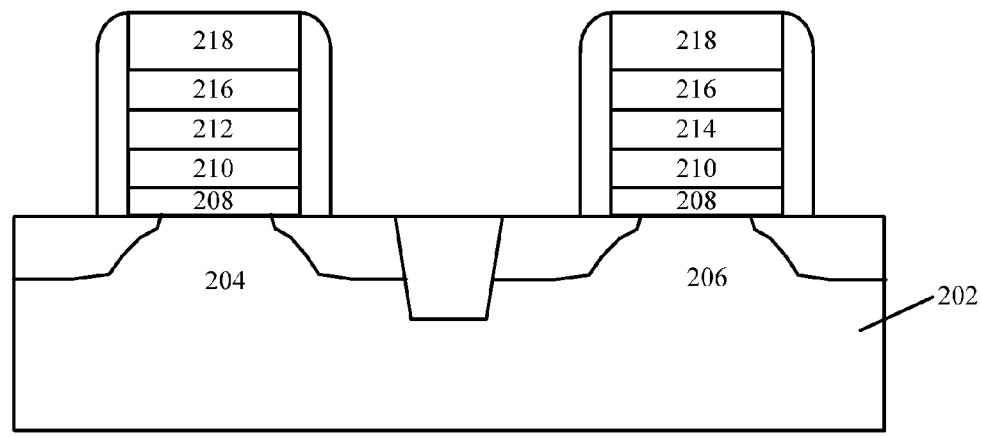

The flow then goes to step 107. With reference to FIG. 8, where a polycrystalline silicon layer 218 is deposited on the metal gate after the low-temperature annealing, in order to improve the processing controllability of the device. Of course, other materials may also be used for deposition, for example, an amorphous silicon layer, a polycrystalline germanium layer, a amorphous germanium layer, etc., which may also fall within the scope of the present invention. Finally, in step 108, as shown in FIG. 9, device processing is performed to achieve the semiconductor device.

According to the present invention, after depositing the metal gate material, an oxygen molecule catalyzing layer for catalyzing oxygen molecules is deposited. Then, a low-temperature PMA annealing process is performed to decompose the oxygen molecules in the annealing atmosphere into more active oxygen atoms. These oxygen atoms are diffused into the high-k gate dielectric film through the metal gate to supplement the oxygen vacancies in the high-k film, in order to alleviate oxygen vacancies in the high-k film and improve the quality of the high-k film. Because of the formation of the oxygen molecule catalyzing layer, the thermal annealing temperature after the high-k gate dielectric deposition may be greatly decreased. In the processing of the semiconductor device comprising high-k gate dielectric/metal gate structure in prior art, after the high-k gate dielectric layer is deposited, the high-k gate dielectric layer should be annealed at a certain temperature, in order to improve the density of the high-k gate dielectric and decrease the content of impurities, wherein the annealing temperature is in the range of about 700-900° C. Since regrowth of the oxide layer between the high k gate dielectric and the semiconductor substrate (for example, Si) at this temperature will cause augmentation of the $SiO_2$ interface layer in the device, which may further increase the equivalent oxide thickness (EOT) of the device. In the present invention, since PDA thermal treatment at low temperature may be carried out, the temperature for the thermal treatment may decrease to the range of about 100-600° C. The regrowth of the oxide layer between the high-k gate dielectric and the Si substrate under a high temperature may be effectively prevented. Through formation of the oxygen molecule catalyzing layer, the oxygen layer thickness between the high-k gate dielectric and Si substrate may be decreased to less than 0.5 nm, which is a great improvement compared with the interface layer having a thickness of about 0.8 nm without forming the oxygen molecule catalyzing layer. Therefore, by this process, the oxygen vacancies and defects of the high-k gate dielectric film will be alleviated by the catalyzing decomposition function of the catalyzing layer to oxygen molecules at a lower temperature, and furthermore, growth of the $SiO_x$ interface layer with low dielectric constant caused by the conventional PDA process at high temperature may be prevented, thereby the EOT of the entire gate dielectric layer may be effectively controlled, and the continuous scaling of the MOS device may be achieved.

Although the embodiments and their advantages have been described in detail, it is readily apparent to those having ordinary skill in the art that various alterations, substitutions and modifications may be made to the embodiments without departing from the spirit of the present invention and the scope as defined by the appended claims. For other examples, it may be easily recognized by a person of ordinary skill in the art that the order of the process steps may be changed without departing from the scope of the present invention.

In addition, the scope to which the present invention is applied is not limited to the process, mechanism, manufacture, material composition, means, methods and steps described in the specific embodiments in the specification. A person of ordinary skill in the art would readily appreciate from the disclosure of the present invention that the process, mechanism, manufacture, material composition, means, methods and steps currently existing or to be developed in future, which perform substantially the same functions or achieve substantially the same as that in the corresponding embodiments described in the present invention, may be applied according to the present invention. Therefore, it is intended that the scope of the appended claims of the present invention comprises these process, mechanism, manufacture, material composition, means, methods or steps.

What is claimed is:

1. A method of manufacturing a semiconductor device, comprising;

providing a semiconductor substrate having a first region and a second region, wherein the doping type of the first region is different from the doping type of the second region;

forming an interface layer on the semiconductor substrate;

forming a gate dielectric layer on the interface layer;

forming a first work function metal gate layer belonging to the first region and a second work function metal gate layer belonging to the second region on the gate dielectric layer, respectively;

forming an oxygen molecule catalyzing layer on the first and second work function metal gate layers;

annealing the device to decompose oxygen molecules into oxygen atoms in annealing environment, wherein the oxygen atoms are diffused into the gate dielectric to supplement oxygen vacancies and defects;

forming a polysilicon layer on the oxygen molecule catalyzing layer; and processing the device to form a first gate belonging to the first region and a second gate belonging to the second region, respectively.

2. The method according to claim 1, wherein the step of annealing the device comprises low temperature annealing.

3. The method according to claim 1 or 2, wherein the step of annealing the device comprises PMA annealing.

4. The method according to claim 3, wherein the oxygen molecule catalyzing layer is formed of at least one element selected from Pt, Co, Zn, Pd, PtBix, and PtNix, or any combination thereof.

5. The method according to claim 4, wherein the annealing temperature is in the range of about 100° C.-600° C.

6. The method according to claim 4, wherein the oxygen molecule catalyzing layer has a thickness in the range of about 1-100 nm.

7. The method according to claim 4, wherein the gate dielectric layer is formed of at least one element selected from $HfO_2$, $La_2O_3$, $Y_2O_3$, HfSiO, HfSiON, HfTaO, HfSiO, HfZrO, HfLaO, HfAlO, HfAlON, HfLaON, and LaAlO, or any combination thereof.

8. The method according to claim 7, wherein the gate dielectric layer has a thickness in the range of about 2-10 nm.

9. The method according to claim 4, wherein the first work function metal gate layer is formed of at least one element selected from TaC, HfC, TiC, TiN, TaN, TaTbN, TaErN, TaYbN, TaSiN, HfSiN, MoSiN, RuTax, NiTax, polysilicon, and metal silicide, or any combination thereof.

10. The method according to claim 4, wherein the second work function metal gate layer is formed of at least one element selected from TaCx, TiN, TaN, MoNx, TiSiN, TiCN, TaAlC, TiAlN, PtSix, $Ni_3Si$, Pt, Ru, Ir, Mo, HfRu, RuOx, polysilicon, and metal silicide, or any combination thereof.

11. The method according to claim 4, wherein the first and second work function metal gate layers have a thickness in the range of about 2-50 nm.

* * * * *